(12) United States Patent
Mikubo et al.

(10) Patent No.: US 8,264,659 B2
(45) Date of Patent: Sep. 11, 2012

(54) LIQUID CRYSTAL DISPLAY DEVICE

(75) Inventors: Kazuyuki Mikubo, Tokyo (JP); Takeya Hashiguchi, Tokyo (JP); Hitoshi Sakamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 193 days.

(21) Appl. No.: 12/920,423

(22) PCT Filed: Mar. 19, 2009

(86) PCT No.: PCT/JP2009/055435
§ 371 (c)(1),
(2), (4) Date: Aug. 31, 2010

(87) PCT Pub. No.: WO2009/119442
PCT Pub. Date: Oct. 1, 2009

(65) Prior Publication Data
US 2011/0001898 A1   Jan. 6, 2011

(30) Foreign Application Priority Data
Mar. 25, 2008   (JP) ................................ 2008-077962

(51) Int. Cl.
*G02F 1/1333* (2006.01)
(52) U.S. Cl. .............................. 349/161; 349/58; 349/56
(58) Field of Classification Search .................... 349/19, 349/20, 56, 58, 72, 161, 153
See application file for complete search history.

(56) References Cited

U.S. PATENT DOCUMENTS

| | | | |
|---|---|---|---|
| 6,900,990 B2 * | 5/2005 | Tomioka | 361/752 |
| 7,867,070 B2 * | 1/2011 | Day | 454/184 |
| 2005/0225936 A1 * | 10/2005 | Day | 361/687 |
| 2007/0213000 A1 * | 9/2007 | Day | 454/184 |
| 2011/0001898 A1 * | 1/2011 | Mikubo et al. | 349/58 |

FOREIGN PATENT DOCUMENTS

| | | |
|---|---|---|
| JP | 62-55395 A | 4/1987 |
| JP | 63-298424 A | 12/1988 |
| JP | 07-210093 A | 8/1995 |
| JP | 3975506 B2 | 11/1998 |
| JP | 2000-284701 A | 10/2000 |
| JP | 2001-068880 A | 3/2001 |
| JP | 2005-084270 A | 3/2005 |
| JP | 2007-052951 A | 3/2007 |
| WO | 2007/116116 A1 | 10/2007 |

* cited by examiner

*Primary Examiner* — Brian Healy
(74) *Attorney, Agent, or Firm* — Sughrue Mion, PLLC

(57) ABSTRACT

A liquid crystal display device includes a sealed housing part, a liquid crystal display part disposed at the front face of the housing part, a light source part housed in the housing part to generate the light to be displayed on the liquid crystal display part, an electric power supply part housed in the housing part to perform electric power supply, a control part housed in the housing part to perform control, and a heat exchange part disposed at the rear face of the housing part to cool the heat generated in the housing part. The heat exchange part includes an air stirring part for stirring the air in the housing part, a forced air cooling part covered with a duct in which the air stirring part is installed and constructed from a plate extending into the housing part, and a natural air cooling part constructed from a plate extending to the outside of the housing part. The forced air cooling part and the natural air cooling part are integrated with a rear face plate of the housing part.

7 Claims, 5 Drawing Sheets

LIQUID CRYSTAL DISPLAY DEVICE

TECHNICAL FIELD

The present invention relates to a large liquid crystal display device to be installed in public places, such as the partially outdoor areas of a train station platform, an airport lobby, or the like and particularly, to a sealed liquid crystal display device which prevents the entrance of dust which is scattered in ambient air.

Priority is claimed Japanese Patent Application No. 2008-077962 filed on Mar. 25, 2008, the contents of which are incorporated herein by reference.

BACKGROUND ART

In a liquid crystal display device, in order to realize high reliability of the image quality uniformity, life span, or the like of a liquid crystal panel, a cooling technique is used which satisfies temperature standards to guarantee the operation of a light source part, a control part, and a power supply part.

For this purpose, generally, a technique is used for providing an air intake port and an exhaust port, which introduce surrounding low-temperature air, in a liquid crystal display device, and introducing the low-temperature air to cool a light source part, a control part, and a power supply part which are mounted in the liquid crystal display device.

In this technique, however, dust including non-conductive and conductive substances which are scattered in ambient air enters a liquid crystal display device which is installed in public places, such as the partially outdoor areas, from the intake port provided in the liquid crystal display device. The dust builds up on the light source part, control part, and power supply part inside the liquid crystal display device.

Particularly, when dust including conductive substances has entered the inside of the liquid crystal display device, short circuiting may occur between electronic circuit parts mounted in the liquid crystal display device, may hinder reliability, and cause a problem in terms of the quality of the product.

For this reason, the conventional technique cannot be said to be satisfactory in terms of dust resistance and cooling performance in regard to a liquid crystal display device to be installed in public places, such as the partially outdoor areas.

A technique regarding a liquid crystal display device and a cooling method of a lamp part of the liquid crystal display device is disclosed in Patent Document 1. This technique includes a housing part which houses a dust resistant fluorescent lamp of the liquid crystal display device, and a cooling mechanism which introduces air heated by the fluorescent lamp from the housing part, then cools the air, and returns the cooled air to the housing part, as a device having a cooling mechanism in a back light part. Therefore, some effects are exhibited as a configuration which has dust resistance, cooling performance and prevention of dust entering from ambient air in the sealed fluorescent lamp part.

However, in recent years, the power consumption of a back light serving as a light source part and an electric power supply part have tended to increase due to the progress of the improvement in the quality of the product due to increases in the screen size and luminance of the liquid crystal display device.

Additionally, an audio function and a personal computer function are also included, and the product performance has also improved. Along with this, the power consumption of the whole liquid crystal display device is increasing.

Moreover, there is a remarkable relationship between the life span and temperature of the liquid crystal panel. For example, in a case where the installation environment temperature in the partially outdoor areas in summer is 40° C., the temperature of the liquid crystal panel should be less than or equal to 55° C. including a design margin.

In addition, in the installation conditions in the partially outdoor areas mentioned above, in order to prevent the entrance of dust which is scattered in ambient air and to obtain high reliability, it is desired that the liquid crystal display device itself has dust resistance, and a cooling part which satisfies the temperature standards is included.

Additionally, the slimming, weight saving, and cost reduction of a large screen liquid crystal display device are desired, and a heat problem accompanying dust resistance and cooling performance becomes more serious than in the past.

In such a technical background, in the cooling method of the lamp part of the liquid crystal display device disclosed in Patent Document 1, the cooling part of the fluorescent lamp part with dust resistance is provided with communication holes in the fluorescent lamp and two U-shaped ducts, and cools only the heat generated from the fluorescent lamp by circulating air within the ducts by an air blowing part.

However, according to the ratio of amount of heat in the recent whole liquid crystal display device mentioned above, the amount of heat generated from the fluorescent lamp, and a light source portion of an inverter circuit is about 60%. Additionally, the amount of heat generated from electronic circuit parts mounted in an audio function, a personal computer function, an electric power supply part, or the like is about 40%.

Accordingly, with regard to other audio functions, personal computer functions, and electric power supply parts, the sealing performance of preventing the entrance of dust which is scattered in ambient air and the cooling performance and high reliability which satisfy the temperature standards of all mounted parts at an installation environment temperature of 40° C. cannot be secured only by the cooling part of the fluorescent lamp part.

Patent Document 1: Japanese Patent No. 3975506

DISCLOSURE OF INVENTION

Problem to be Solved by the Invention

The present invention was made in consideration of the above situation, and aims at preventing the entrance of dust which is scattered in ambient air, thereby providing a highly-reliable liquid crystal display device. Additionally, the present invention aims at providing a cooling part which satisfies the temperature which guarantees the operation of all electronic circuit parts mounted in a liquid crystal display device in installation conditions of an installation environment temperature of 40° C. Moreover, the present invention aims at providing a liquid crystal display device in which the reductions in weight and cost of the device have been realized.

Means for Solving the Problem (1) The present invention has been made to solve the above-described problems. According to an aspect of the present invention, there is provided a liquid crystal display device including: a sealed housing part; a liquid crystal display part disposed at the front face of the housing part; a light source part housed in the housing part to generate the light to be displayed on the liquid crystal display part; an electric power supply part housed in the housing part to perform electric power supply; a control part housed in the housing part to perform control; and a heat exchange part disposed at the rear face of the housing part to cool the heat generated in the housing part, wherein the heat exchange part includes an air stirring part which stirs the air in the housing part, a forced air cooling part covered with a duct in which the air stirring part is installed and constructed from a plate extending into the housing part, and a natural air cooling part constructed from a plate extending to the outside of the housing part, and wherein the forced air cooling part and the natural air cooling part are integrated with a rear face plate of the housing part.

(2) In the liquid crystal display according to the aspect of the present invention, the plate surface area of the forced air cooling part and the plate surface area of the natural air cooling part may be different from each other.

(3) In the liquid crystal display according to the aspect of the present invention, the forced air cooling part and the natural air cooling part are each constructed from plates with a rugged surface and the surface areas of the plates with the rugged surface may be different from each other.

(4) In the liquid crystal display according to the aspect of the present invention, the forced air cooling part and the natural air cooling part may be each constructed from box-shaped rugged plates with a cavity.

(5) In the liquid crystal display according to the aspect of the present invention, the forced air cooling part may be a box-shaped rugged plate with an inclination at an airflow inlet.

(6) In the liquid crystal display according to the aspect of the present invention, the rear face plate of the housing part may be wavy rugged plate-shaped.

(7) In the liquid crystal display according to the aspect of the present invention, the rear face plate of the housing part may be muscle rugged plate-shaped.

Effect of the Invention

In the liquid crystal display device of the present invention, the heat exchange part includes an air stirring part which stirs the air in the housing part, a forced air cooling part covered with a duct in which the air stirring part is installed and which is constructed from a plate extending into the housing part, and a natural air cooling part constructed from a plate extending to the outside of the housing part. The forced air cooling part and the natural air cooling part are integrated with a rear face plate of the housing part.

Thereby, forced convection of the heat generated from the liquid crystal display device is caused by the heat stirring part, heat is moved to an upper portion of the device, and heat is induced toward the duct which covers the forced air cooling part. Hence, it is possible to efficiently transfer heat to the natural air cooling part from the forced air cooling part in the duct, reduce a temperature difference along with an absolute temperature reduction in the liquid crystal display device with sealing performance, and as temperature can be made to be uniform. Therefore, dust resistance and cooling performance can be simultaneously satisfied.

Therefore, it is possible to realize stabilization of the temperature of electronic circuit parts, such as a light source part, a power supply part, and a control part, the stabilization of luminance by lighting the fluorescent lamp at a constant luminance, and long life span of the liquid crystal panel by uniformizing temperature.

Moreover, since the entrance of the dust which is scattered in ambient air can be prevented by making the whole liquid crystal display device into a sealed structure, it is possible to provide a liquid crystal display device which satisfies both dust resistance and cooling performance.

As heat exchange functions in the liquid crystal device of the present invention, the heat generated inside the liquid crystal device is efficiently received by the forced air cooling part, heat is transferred to the natural air cooling part, and finally a path in which the radiation of heat into ambient air becomes possible by natural convection is formed. Therefore, the effect that has both sealing performance and cooling performance is obtained.

Additionally, the forced air cooling part inside the sealed housing part and the natural air cooling part outside the sealed housing part are integrated. Therefore, compared with known techniques, the thermal resistance between the internal air temperature and the plates of the housing part can be reduced, and the heat generated from a liquid crystal part, a light source part, a control part, or the like which are mounted in the liquid crystal display device can be efficiently cooled. If the number of vertical plate-shape flat plates is optimized with respect to the forced air cooling part of a heat exchange function according to the capability of a stirring fan, the thermal resistance between the internal air temperature and the plates of the housing part can be reduced.

Additionally, in the liquid crystal display device of the present invention, the plate surface area of the forced air cooling part and the plate surface area of the natural air cooling part are different from each other. Therefore, the plate surface area of the forced air cooling part and the plate surface area of the natural air cooling part can be made to be a highly efficient heat-receiving surface area of the forced air cooling part which has excellent cooling efficiency based on the relationship with air volume and the efficient surface area which radiates heat to the ambient air in natural convection. Hence, it is possible to provide a liquid crystal display device which has both sealing performance and cooling performance by the combination of the aforementioned configurations.

Additionally, in the liquid crystal display device of the present invention, the forced air cooling part and the natural air cooling part are each constructed from plates with a rugged surface, and the surface areas of the plates with the rugged surface are different from each other. Therefore, the plate surface area of the forced air cooling part and the plate surface area of the natural air cooling part easily becomes the highly efficient heat-receiving surface area of the forced air cooling part which has excellent cooling efficiency based on the relationship with air volume and the efficient surface area which radiates heat to the ambient air in natural convection.

Additionally, in the liquid crystal display device of the present invention, the forced air cooling part and the natural air cooling part are each constructed from box-shaped rugged plates with a cavity. Therefore, a ventilation passage with a cavity can be provided, the air flow speed of the forced air cooling part can be increased, and the chimney effect of the natural air cooling part can be expected. Accordingly, both sealing performance and cooling performance are obtained.

Moreover, the forced air cooling part is a box-shaped rugged plate with an inclination at an airflow inlet. Therefore, the air flow speed of the forced air cooling part can be increased, and the chimney effect of the natural air cooling part is further improved.

Additionally, in the liquid crystal display device of the present invention, the rear face plate of the housing part is wavy rugged plate-shaped. Therefore, since rigidity is increased even with the same thickness compared to a flat plate, rigidity and weight saving of the liquid crystal display device is obtained in addition to both sealing performance and cooling performance.

Additionally, in the liquid crystal display device of the present invention, the rear face plate of the housing part is muscle rugged plate-shaped. Therefore, since rigidity is increased even with the same thickness compared to a flat plate, the effect achieving the rigidity and weight saving of the liquid crystal display device is obtained in addition to both sealing performance and cooling performance.

As described above, in the liquid crystal display device of the present invention, by the heat exchange part with an inclination, such as the box-shaped and inclined heat exchange part, the air flow speed of the forced air cooling part can be increased, or the heat transfer promotion effect by convection, such as the chimney effect of the natural air cooling part, can be enhanced. In addition, a radiation heat transfer promotion effect can also be expected by painting the constituent members components of the housing part in black.

Additionally, the method and various PQ performances of the air stirring part can be selected according to the size, power consumption, and internal ventilation resistance of the liquid crystal display device by using the above liquid crystal display device selectively according to the air volume of the air stirring part. A liquid crystal display device which has both sealing performance and cooling performance can be realized, for example, by predicting the size, power consumption, internal structure, ventilation resistance, or the like of the liquid crystal display device in advance, for example, by theoretical calculation, and selecting a model according to the PQ performance of an air-cooling fan.

REFERENCE SYMBOLS

1: LIQUID CRYSTAL DISPLAY DEVICE,
1a: HOUSING PART
2: LIQUID CRYSTAL PANEL
3: TRANSPARENT NON-REFLECTIVE PLATE
4: INVERTER CIRCUIT
5: FLUORESCENT LAMP
6: LIQUID CRYSTAL DISPLAY PART
7: LIGHT SOURCE PART
8: ELECTRIC POWER SUPPLY PART
9: CONTROL PART
10: AIR STIRRING PART
11, 11a, 11b, 11c, 11d: HEAT EXCHANGE PART
11a: FORCED AIR COOLING PART
11b: NATURAL AIR COOLING PART
12: REAR FACE PLATE OF HOUSING PART
13: DUCT
14: FORCED CONVECTION CURRENT
15: NATURAL CONVECTION CURRENT
16: GRAPHITE SHEET
17: CHASSIS
18: PLATE WITH RUGGED SURFACE
20: PLATE-SHAPED RUGGED PORTION
21: INSIDE OF HOUSING PART
22: OUTSIDE OF HOUSING PART
30: BOX-SHAPED RUGGED PLATE
31: CAVITY
40: BOX-SHAPED RUGGED PLATE WITH INCLINATION
41: INCLINATION
50: WAVY RUGGED PLATE
60: MUSCLE RUGGED PLATE

BEST MODE FOR CARRYING OUT THE INVENTION

Hereinafter, embodiments of the present invention will be described with reference to the drawings. In addition, the drawings to be referred to in the following description are those illustrating a liquid crystal display device of the present embodiment. The sizes, thicknesses, or dimensions of shown individual members may be different from those of an actual liquid crystal display device.

First Embodiment

Figure 1A:
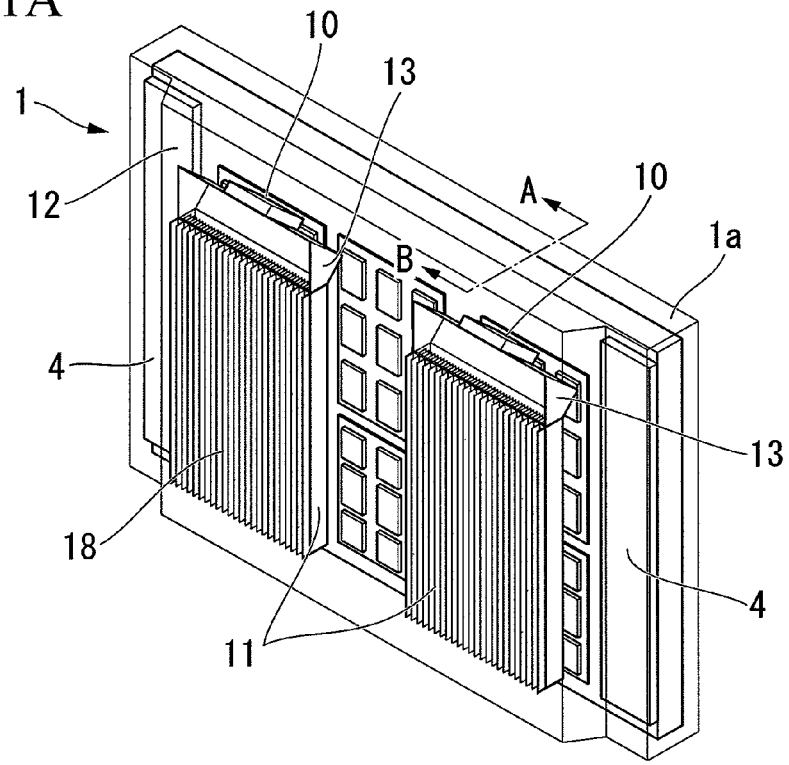
FIG. 1A is a perspective view of a liquid crystal display device according to a first embodiment of the present invention.
Figure 1B:
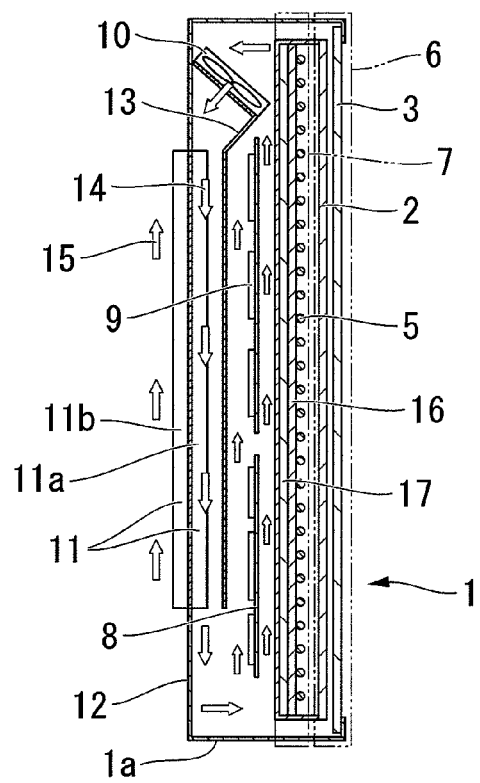
FIG. 1B is a sectional view at a line A-B of FIG. 1A.

FIGS. 1A and 1B show the basic configuration of a liquid crystal display device 1 according to a first embodiment of the present invention. FIG. 1A is a perspective view of the liquid crystal display device 1. Additionally, FIG. 1B is a sectional view along a line A-B of FIG. 1A.

As shown in FIGS. 1A and 1B, the liquid crystal display device 1 includes a display part which has a fluorescent lamp 5 as a display light. Additionally, the liquid crystal display device 1 is mounted with a liquid crystal display part 6 in which the fluorescent lamp 5, an inverter circuit 4, a liquid crystal panel 2, or the like are housed, and an electric power supply part 8 to the liquid crystal display part 6, a control part 9 (light source, audio, personal computer function, or the like), or the like, which are at the rear face of the liquid crystal display part 6. Additionally, the liquid crystal display device 1 has, at a rear face plate 12 of a housing part 1a, an air stirring part 10 which stirs generated heat due to the operations of the liquid crystal display part 6, the electric power supply part 8, and the control part 9 so as to perform thermal induction in the sealed housing part 1a, and a heat exchange part 11 in which a forced air cooling part 11a and a natural air cooling part 11b are integrally formed. Moreover, the liquid crystal display device 1 includes a duct 13 which covers the forced air cooling part 11a in the heat exchange part 11.

(Air Stirring Part)

Next, the air stirring part 10 will be described in detail with reference to FIG. 1B. The flow of air by the air stirring part 10 is conceptually shown as a forced convection current 14 and a natural convection 15 in FIG. 1B. A graphite sheet 16 is mounted on the whole rear face of the fluorescent lamp 5.

The graphite sheet 16 has a heat conductivity of 500 W/mk or higher in an in-plane direction of the sheet, and has anisotropy with a heat conductivity of 5 W/mk in the sheet thickness direction. This diffuses the heat generated from the fluorescent lamp 5 in the in-plane direction of the graphite sheet 16, consequently reducing the temperature difference (temperature uniformizing) of the fluorescent lamp 5, and the effect of obtaining uniform irradiation light for luminance stabilization is obtained.

Moreover, the rear face of the graphite sheet 16 includes a chassis 17 made of a metallic material, such as aluminum or iron. Therefore, the heat from the fluorescent lamp 5 can be efficiently transmitted to the chassis 17 by taking advantage of the characteristic of a heat conductivity of 5 W/mk in the thickness direction of the graphite sheet 16.

Meanwhile, a convection current, similar to that of the liquid crystal display part 6, is generated along an upper portion of the housing part 1a with the generation of heat due to the electric power supply part 8 and the control part 9 which are mounted in the liquid crystal display device 1.

Thus, the high-temperature air generated along with the liquid crystal display part 6 is thermally induced by the air stirring part 10 by the air stirring part 10 provided at an upper portion of the liquid crystal display device 1.

In addition, the air stirring part 10 means all air-cooling parts (an air-cooling fan, a piezoelectric fan, or the like) and is not particularly limited. Accordingly, the air stirring part 10 causes the thermally-induced high-temperature air to pass through the inside of the heat exchange part 11 provided at the rear face of the liquid crystal display device 1 and the inside of a plate 18 with a rugged surface in the forced air cooling part 11a covered with the duct 13. Thereafter, air circulates through the inside of a sealed device by repeating heat exchange of low-temperature air with the high-temperature air.

This makes uniform the air temperature inside the housing part 1a of the liquid crystal display device 1, and the effect of satisfying temperature standards can be obtained due to the air volume of the air stirring part 10, and the surface area or optimal shape of the heat exchange part 11.

In this way, in the liquid crystal display device 1, light enters and is displayed on the liquid crystal panel 2 due to the inverter circuit 4 (a direct-current input is converted into a high-voltage alternating current) for lighting the fluorescent lamp. At this time, as mentioned above, long life span by temperature stabilization and irradiation of light with stable luminance are desired in the fluorescent lamp 5. Therefore, in terms of the whole liquid crystal display device 1, an optimal method and a configuration which satisfy temperature standards are required.

Additionally, since the entrance of dust which is scattered in ambient air, particularly, the entrance of the dust having conductivity as mentioned above, can be a cause of fatal failure in the liquid crystal display device 1, it is desired to provide an optimal configuration which satisfies both with regard to the issue of the trade-off between dust-proofing/drip-proofing and cooling performance.

(Cooling Performance)

Figure 2:
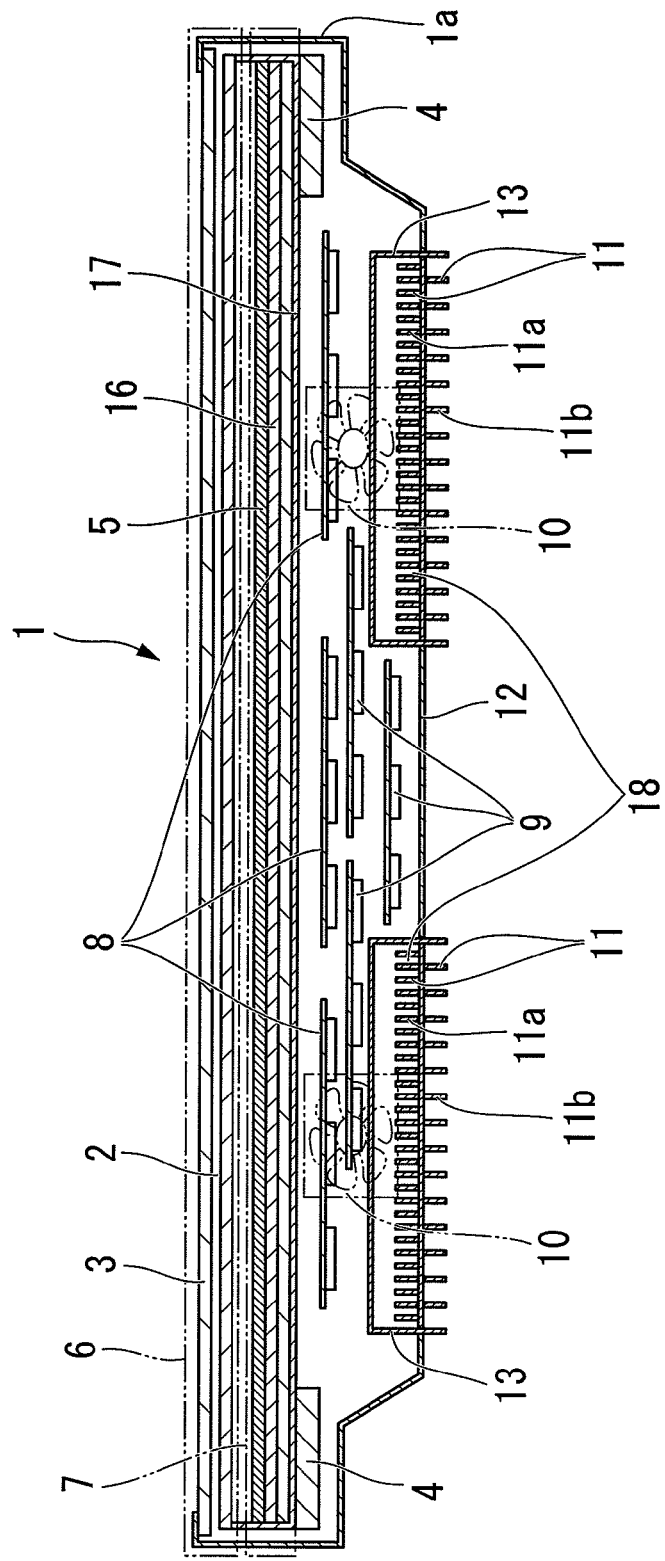
FIG. 2 is a perspective plan view of the liquid crystal display device according to the first embodiment of the present invention.

Subsequently, the cooling performance of the liquid crystal display device 1 of the present embodiment will be described in detail with reference to FIG. 2.

The cooling performance in the sealed housing part 1a is determined by the size of the surface area of the housing part 1a, and the emissivity of members which constitute the housing part 1a. Therefore, the thermal resistance between temperature of the heat source of the liquid crystal display device 1 and the internal air temperature of the housing part 1a is reduced. Moreover, the value of the thermal resistance between the internal air temperature of the housing part 1a and a case of the housing part 1a is reduced. Eventually, it is possible to obtain a targeted cooling performance due to a reduction in the thermal resistance between the outside air temperature from the surface of the case of the housing part 1a.

In the present embodiment, about 40% of the heat dispersed and generated by the electric power supply part 8, the control part 9, or the like is moved by an ascending air current in regard to the liquid crystal display part 6 (light source) which generates about 60% of the heat from the liquid crystal display device 1. Moreover, heat is forcibly moved to a lower portion of the housing part 1a by the air stirring part 10.

That is, the heat generated from the liquid crystal display device 1 arrives at the upper portion of the housing part 1a as the high-temperature air as mentioned above. A sealed air circulation structure is provided in which the high-temperature air returns as low-temperature air through the plate 18 (forced air cooling part 11a) with a rugged surface formed integrally with the rear face plate 12 of the housing part 1a due to the heat exchange part 11 provided at the rear face, the duct 13 which covers the forced air cooling part 11a which constitutes the heat exchange part 11, and the air diffusing part 10.

In this way, the liquid crystal display device 1 is provided with the air stirring part 10 and the heat exchange part 11, and the forced air cooling part 11a of the heat exchange part 11 is covered with the duct 13. Since this can thermally induce the high-temperature air thermally diffused by the air stirring part 10 intensively, and accelerate a cooling wind speed locally, a cooling effect can be expected.

On the other hand, the air volume in the whole housing part 1a decreases with a loss in pressure. Therefore, in the liquid crystal display device having a relatively large volume, when an air-cooling fan is used as the air stirring part 10, it is desirable to obtain ventilation resistance in a ventilation passage of the housing part 1a or in the forced air cooling part 11a of the heat exchange part 11 and in the duct 13, according to the PQ performance (P: maximum pressure, and Q: maximum air volume) of the air-cooling fan in advance by, for example, theoretical calculation, and to select the PQ performance of the air-cooling fan required for cooling performance.

Additionally, if the PQ performance of the air-cooling fan is low, the improvement in cooling performance may be expected by removing the duct 13 which becomes a ventilation resistance, increasing the air volume in the housing part 1a, and radiating heat using the surface of a metal case of the whole housing part 1a.

Moreover, the amount of heat generation of the fluorescent lamp 5 and the inverter circuit 4 accounts for about 60% of the whole as mentioned above. Therefore, in regard to such heat emitted to the heat exchange part 11 provided at the rear face of the liquid crystal display device 1, an arrangement may be preferable in which the direction of a wind from the air stirring part 10 travels toward the forced air cooling part 11a provided in the heat exchange part 11.

(Heat Exchange Part)

Figure 3:
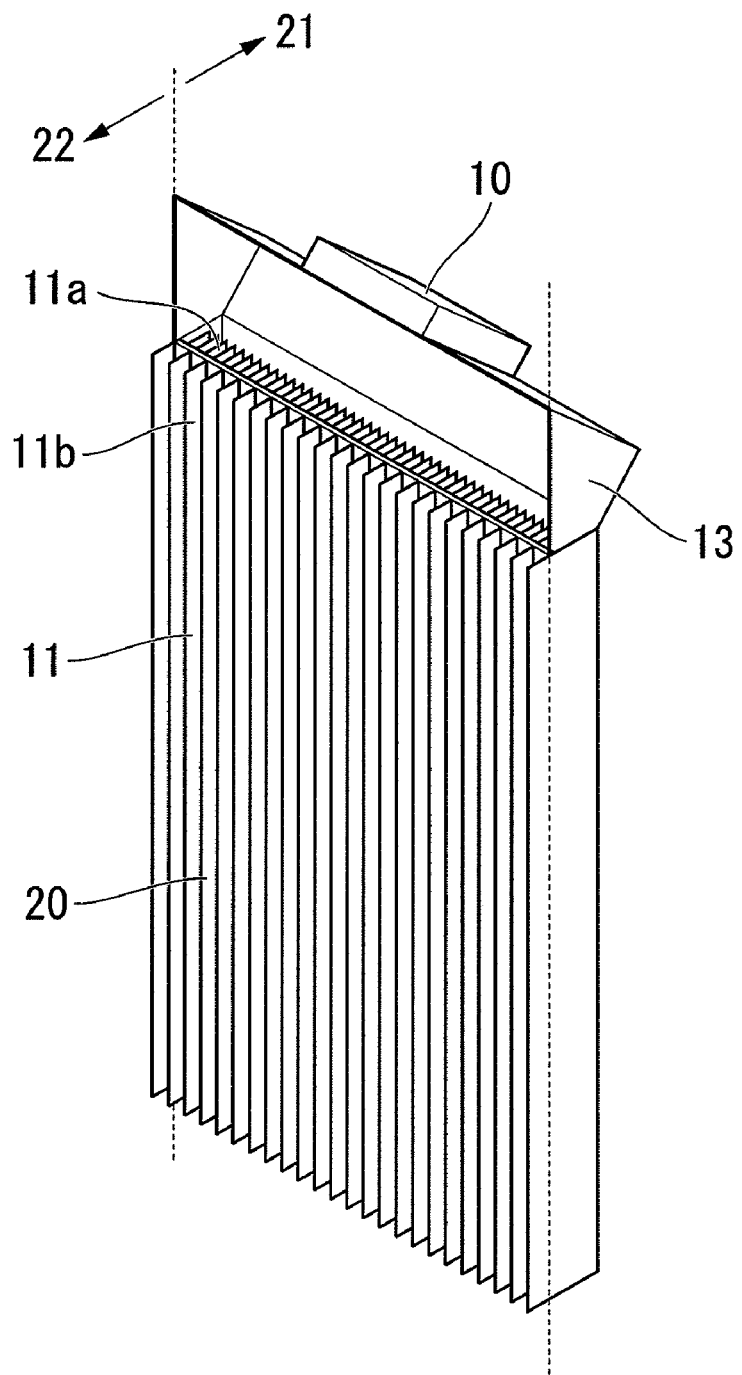
FIG. 3 is an enlarged view showing a heat exchange part, in the liquid crystal display device according to the first embodiment of the present invention.

The heat exchange part 11 having plate-shaped rugged portions 20 will be described in detail with reference to FIG. 3.

As for the heat exchange part 11, it is desirable to use a thermally conductive metallic material with relatively high heat conductivity, such as an aluminum material or a copper material.

In the heat exchange part 11, the height H and length L of the plate-shaped rugged portions 20 are not particularly limited, and can be appropriately selected in consideration of the low profile, light weight, and low cost of the device. When comparison is made in cases where the height H of the plate-shaped rugged portions 20 is 40 mm and 70 mm, it was confirmed that both satisfy the temperature standards of the liquid crystal display device 1 of the present embodiment.

Additionally, when comparison is made in cases where the length L of the plate-shaped rugged portions 20 is 450 mm, 500 mm, and 600 mm, the cooling performances were in the order of 450 mm<500 mm<600 mm, which was a result which was expected. However, the performance difference at L=500 mm and L=600 mm was small.

In order to efficiently receive heat in the forced air cooling part 11a of the heat exchange part 11 by the air stirring part 10 provided in the liquid crystal display device 1, it is necessary to make a large volume of air flow into the gap between the plate-shaped rugged portions 20 and perform cooling. However, even if the surface area is simply increased (a surface area expansion effect), the ventilation resistance becomes large, and the improvement in performance which is more than expected cannot be obtained.

Therefore, when comparison is made at L=500 mm and L=600 mm, when L=600 mm, the surface area of the plate-shaped rugged portions 20 is large, and the performance of thermal efficiency is superior, whereas there is a reduction in flow speed caused by the ventilation resistance due to the PQ performance of an air-cooling fan to be adopted. Therefore, in a case where there is no significant difference from L=500 mm, L=500 mm is more preferable in terms of weight, the number of products by extrusion molding, and cost.

Additionally, although the gap between plates of the plate-shaped rugged portions 20 which constitute the heat exchange part 11 is not particularly limited, when the thickness of each plate is set to 1.5 mm at L=500 mm, it is preferable that the gap be theoretically less than or equal to 5 mm. Additionally, since the ventilation resistance changes depending on differences in shape inside the housing part 1a in a case where the duct 13 is provided, it is preferable that the optimum gap be about 10 mm.

Although the gap between plates of the natural air cooling part 11b (outside the sealed housing part 1a which is in contact with ambient air) is not particularly limited, at L=500 mm and a plate thickness of 1.5 mm, it is preferable that the gap be about 12 mm.

Other Embodiments

Figure 4:
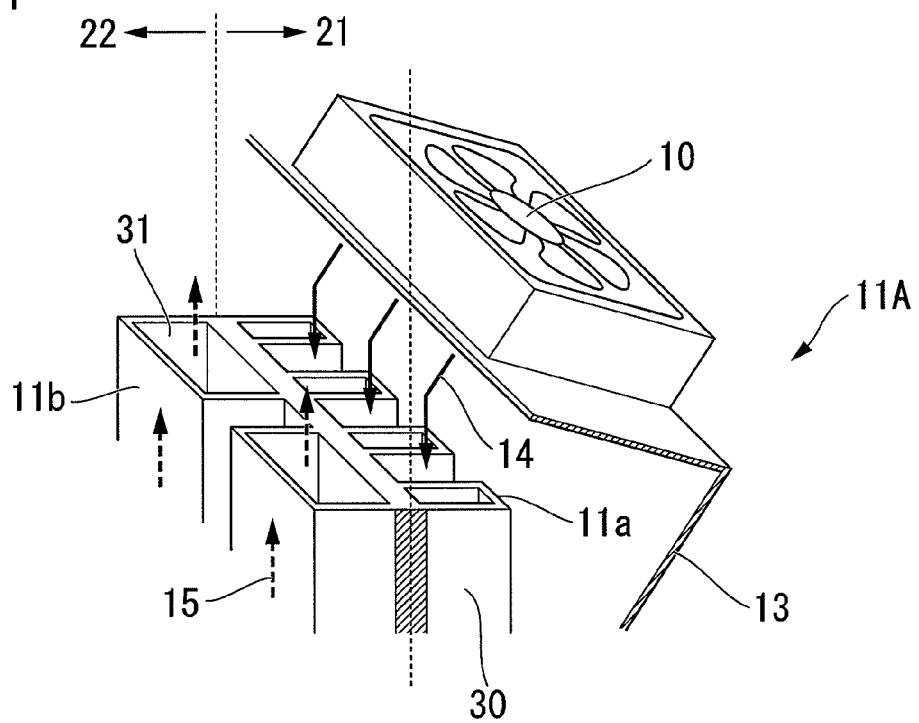
FIG. 4 is an enlarged view showing a box type heat exchange part, in a liquid crystal display device according to a second embodiment of the present invention.
Figure 5:
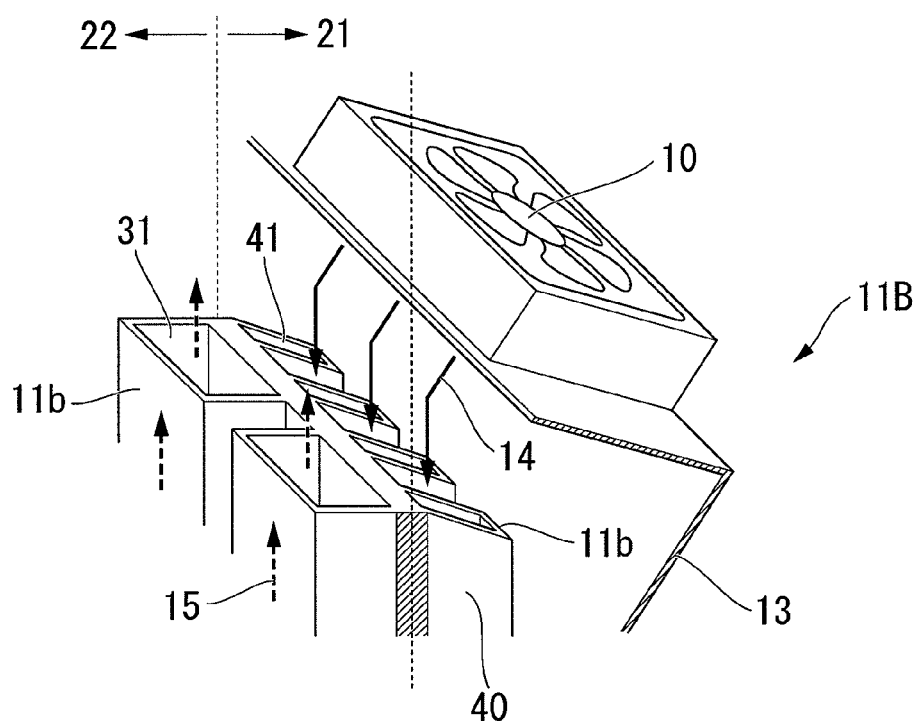
FIG. 5 is an enlarged view showing a box-shaped heat exchange part with a cavity and an inclination, in a liquid crystal display device according to a third embodiment of the present invention.

Additionally, as shown in FIG. 4, a heat exchange part 11a with a box-shaped rugged plate 30 provided with cavity portions 31 may be provided (second embodiment). Additionally, as shown in FIG. 5, a heat exchange part 11b with a box-shaped rugged plate 40 with an inclination, in which an inclination 41 is provided at an airflow inlet, may be provided (third embodiment).

By doing this, the air flow speed increases, and an improvement in performance is expected according to the PQ performance of an air-cooling fan to be used.

Figure 6:
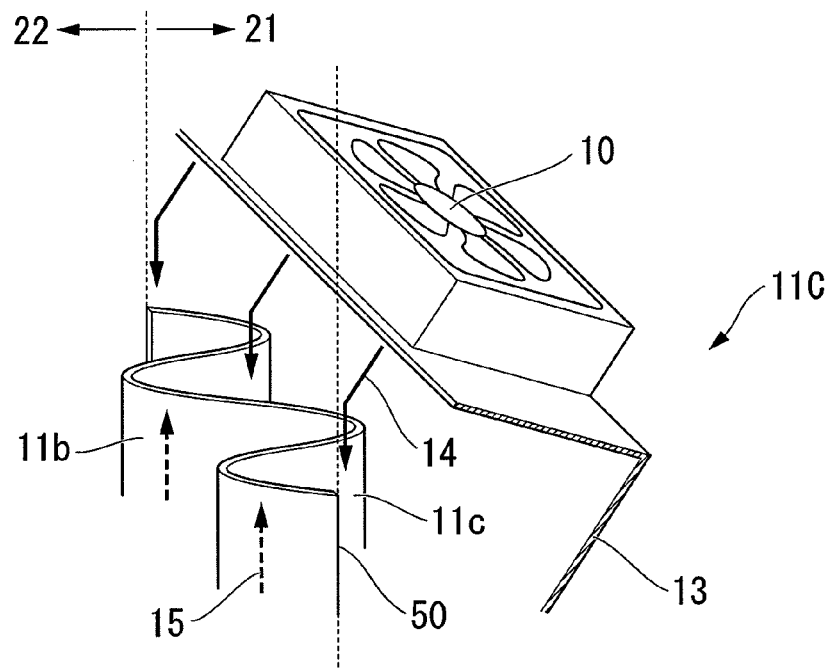
FIG. 6 is an enlarged view showing a heat exchange part with a wavy rugged plate, in a liquid crystal display device according to a fourth embodiment of the present invention.
Figure 7:
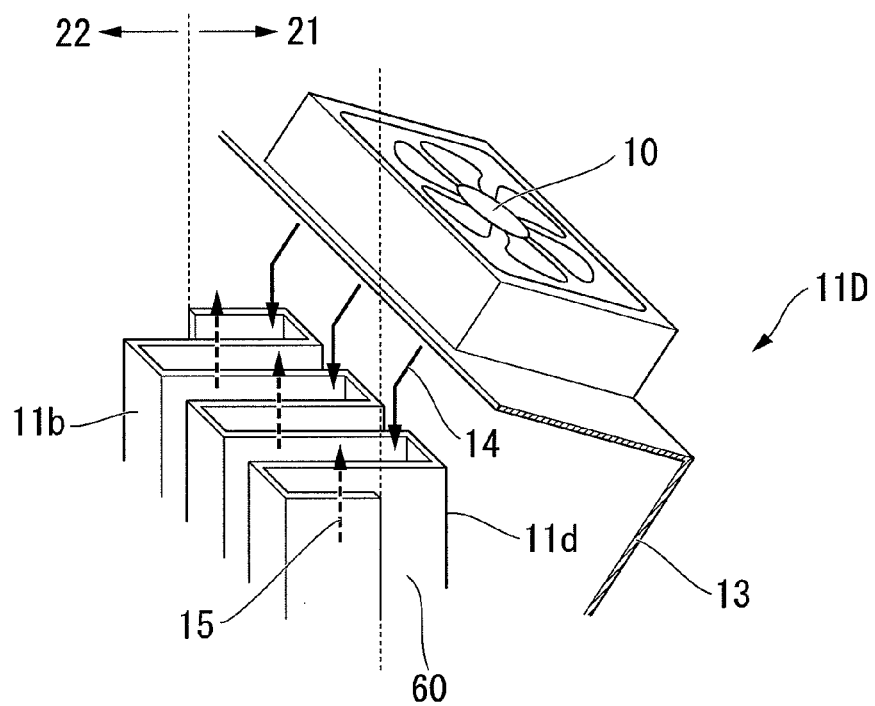
FIG. 7 is an enlarged view showing a heat exchange part with a muscle rugged plate, in a liquid crystal display device according to a fifth embodiment of the present invention.

Additionally, as shown in FIG. 6, a heat exchange part 11c with a wavy rugged plate 50 may be provided (fourth embodiment). Additionally, as shown in FIG. 7, a heat exchange part 11d with a muscle rugged plate 60 may be provided (fifth embodiment).

By doing this, a high-temperature portion inside the liquid crystal display device 1 and a low-temperature portion of an external surface of the liquid crystal display device 1 which is in contact with ambient air are integrally formed. Therefore, further improvements in cooling performance can be obtained as a sealed liquid crystal display device by efficient heat reception of an inner high-temperature portion of the housing part 1a caused by a difference in the surface area of a rugged surface, good radiation heat transfer by painting of the case of the housing part 1a black, and promotion of heat transfer to ambient air from an external wall surface.

Additionally, in these configurations, since rigidity becomes high even with the same thickness compared to a flat plate or the like by adopting the wavy rugged plate 50 or the muscle rugged plate 60, the plate thickness can be reduced, and it is possible to reduce the weight of the liquid crystal display device 1.

Here, the arrangement of the heat exchange parts 11, 11a, 11b, 11c, or 11d and the duct 13 requires full safety designs, such as earthquake resistance strength, for example, when being hung in a station platform. Thus, in order for the attachment space of the liquid crystal display device 1 of the present embodiment to meet VESA standards of a central portion of the rear face of the housing part 1a, two heat exchange functional parts 11, as shown in FIG. 2, are arranged in right and left regions of the liquid crystal display device 1.

Additionally, the ambient air temperature may exceed 40° C. in an environment of installation at the partially outdoor areas in summer. Therefore, when an air-cooling fan, for example, is used for the air stirring part 10, in order to continue repeating operation, it is desirable to use an air-cooling fan with a long life span and to secure high reliability.

Additionally, with regard to installation at a public location, as mentioned above, malfunction, damage, or the like caused by external impact are expected on the surface of the liquid crystal panel 2. Therefore, protection (impact resistance) of the liquid crystal panel 2 is desired, and dust resistance is also required. Therefore, in order to display the viewing angle of the liquid crystal panel 2 comfortably, it is preferable to use a transparent non-reflective plate 3 made of an acrylic material.

On the other hand, when the non-reflective plate 3 is pasted on the surface of the liquid crystal panel 2, there are concerns that rapid heat accumulation may occur, and the surface temperature of the liquid crystal panel 2 may exceed the standard. Particularly, as the gap between the liquid crystal panel 2 and the non-reflective plate 3 becomes large, this causes heat accumulation of the high-temperature air. Also, this affects the life span of the liquid crystal panel 2 as well as causing the temperature of the liquid crystal panel 2 to rise, a significant temperature difference in the surface of the liquid crystal panel 2, and lower luminance. Therefore, it is necessary to reduce the surface temperature of the liquid crystal panel 2 while being sealed.

Thus, in the present embodiment, it is preferable to provide the surface temperature reducing structure of the liquid crystal panel 2 in which a heat conduction path is formed between a metal frame made from aluminum, which constitutes the surroundings of the fluorescent lamp part 5, and the fluorescent lamp 5.

Specifically, it is possible to use, for example, a method of interposing a contact type fixing portion for screwing, and a thermal conductive sheet containing filler metal for further reduction of thermal contact resistance, in the metal frame, and the metal case of the housing part 1a made of an aluminum material or an iron material.

By doing this, for example, even if the liquid crystal display device 1 of the present embodiment has a size of 50 inches or more, it is possible to efficiently transfer and cool the heat of the fluorescent lamp part, which accounts for half of the total amount of heat, to a relatively large metal case surface which covers the liquid crystal display device 1, by radiation heat transfer and heat conduction.

Moreover, for example, by fixing a natural air cooling heat sink made of aluminum or the like to the metal frame so as to form a conduction passage from the fluorescent lamp 5, it could be confirmed that, while being a sealed structure, the cooling performance is obtained which is equivalent to that of a conventional liquid crystal display device having an intake port and an exhaust port.

The embodiments of the present invention have been described with reference to the drawings; however, the detailed configuration thereof is not limited to the embodiments, and designs or the like without departing from the subject matter of the present invention are also included in the claims.

INDUSTRIAL APPLICABILITY

The present invention can be widely utilized as liquid crystal display devices to be installed in public places, for example, can be widely utilized as liquid crystal display devices used for operation status display, information display, or the like to be utilized in the area of a train station platform, an airport lobby, or the like.

The invention claimed is:

1. A liquid crystal display device comprising:
   a sealed housing part;
   a liquid crystal display part disposed at the front face of the housing part;
   a light source part housed in the housing part to generate the light to be displayed on the liquid crystal display part;
   an electric power supply part housed in the housing part to perform electric power supply; and
   a heat exchange part disposed at the rear face of the housing part to cool the heat generated in the housing part,
   wherein the heat exchange part comprises an air stirring part which stirs the air in the housing part, a forced air cooling part covered with a duct in which the air stirring part is installed and constructed from a plate extending into the housing part, and a natural air cooling part constructed from a plate extending to the outside of the housing part, and
   wherein the forced air cooling part and the natural air cooling part are integrated with a rear face plate of the housing part.

2. The liquid crystal display device according to claim 1, wherein the plate surface area of the forced air cooling part and the plate surface area of the natural air cooling part are different from each other.

3. The liquid crystal display device according to claim 1, wherein the forced air cooling part and the natural air cooling part are each constructed from plates with a rugged surface and the surface areas of the plates with the rugged surface are different from each other.

4. The liquid crystal display device according to claim 1, wherein the forced air cooling part and the natural air cooling part are each constructed from box-shaped rugged plates with a cavity.

5. The liquid crystal display device according to claim 4, wherein the forced air cooling part is a box-shaped rugged plate with an inclination at an airflow inlet.

6. The liquid crystal display device according to claim 1, wherein the rear face plate of the housing part is wavy rugged plate-shaped.

7. The liquid crystal display device according to claim 1, wherein the rear face plate of the housing part is muscle rugged plate-shaped.

* * * * *